United States Patent
Choi

(10) Patent No.: US 9,735,294 B2
(45) Date of Patent: Aug. 15, 2017

(54) SOLAR CELL AND MANUFACTURING METHOD THEREOF

(75) Inventor: Chul Hwan Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 69 days.

(21) Appl. No.: 14/110,460

(22) PCT Filed: Apr. 6, 2012

(86) PCT No.: PCT/KR2012/002658
§ 371 (c)(1),
(2), (4) Date: Oct. 8, 2013

(87) PCT Pub. No.: WO2012/138194
PCT Pub. Date: Oct. 11, 2012

(65) Prior Publication Data
US 2014/0026958 A1    Jan. 30, 2014

(30) Foreign Application Priority Data
Apr. 8, 2011    (KR) .................. 10-2011-0032960

(51) Int. Cl.
*H01L 31/0224* (2006.01)
*H01L 31/0749* (2012.01)
*H01L 31/0392* (2006.01)

(52) U.S. Cl.
CPC ......... *H01L 31/022425* (2013.01); *H01L 31/03928* (2013.01); *H01L 31/0749* (2013.01); *Y02E 10/541* (2013.01)

(58) Field of Classification Search
CPC ............ H01L 31/18; H01L 31/022425; H01L 31/1804; H01L 31/03923
See application file for complete search history.

(56) References Cited

U.S. PATENT DOCUMENTS

| 2004/0046496 | A1* | 3/2004 | Mishima ............. 313/504 |
| 2005/0202589 | A1 | 9/2005 | Basol |
| 2007/0000537 | A1 | 1/2007 | Leidholm et al. |
| 2008/0302413 | A1* | 12/2008 | Leidholm et al. ....... 136/252 |
| 2009/0133751 | A1 | 5/2009 | Sreenivasan et al. |
| 2010/0213465 | A1 | 8/2010 | Hauser et al. |
| 2010/0282301 | A1 | 11/2010 | Peter et al. |
| 2010/0300514 | A1 | 12/2010 | Denda et al. |
| 2012/0067413 | A1 | 3/2012 | Jung et al. |

FOREIGN PATENT DOCUMENTS

CN    101093863 A    12/2007
EP    2546887 A1    1/2013
(Continued)

OTHER PUBLICATIONS

Krunks, et al "Extremely thin absorber layer solar cells on zinc oxide nanorods by chemical spray", Solar Energy Materials and Solar Cells, 94, 2010, 1191-1195.*

(Continued)

*Primary Examiner* — Golam Mowla
(74) *Attorney, Agent, or Firm* — Saliwanchik, Lloyd & Eisenschenk

(57) ABSTRACT

A solar cell according to an embodiment includes a substrate; a barrier layer of a nano rod structure on the substrate; a back electrode layer disposed on the barrier layer; a light absorbing layer disposed on the back electrode layer; a buffer layer disposed on the light absorbing layer, and a window layer disposed on the buffer layer.

2 Claims, 2 Drawing Sheets

(56) References Cited

FOREIGN PATENT DOCUMENTS

| KR | 10-2005-0077680 A | 8/2005 |
|----|-------------------|--------|
| KR | 10-2008-0052596 A | 6/2008 |
| KR | 10-2009-0098962 A | 9/2009 |
| KR | 10-2010-0089854 A | 8/2010 |
| KR | 10-2010-0094501 A | 8/2010 |
| KR | 10-2010-0098595 A | 9/2010 |

OTHER PUBLICATIONS

Eom, et al "Nano-scale ZnO buffer layer for inkjet-printed polymer solar cells", Journal of Nanoscience and Nanotechnology, 8, 2008, 5113-5117.*

Sun, et al "Low-temperature sintering of in-plane self-assembled ZnO nanorods for solution-processed high-performance thin film transistors", The jounral of physical chemistry C letter, 111, 2007, 18831-18835.*

Sun, "Surface Tension and Fluid Flow Driven Self-Assembly of Ordered ZnO Nanorod Films for High-Performance Field Effect Transistors," JACS, 2006, pp. 16231-16237.*

Liu, "Hydrothermal Synthesis of ZnO Nanorods in the Diameter Regime of 50 nm," JACS, 2003, p. 4430-4431.*

International Search Report in International Application No. PCT/KR2012/002658, filed Apr. 6, 2012.

Notice of Allowance dated Apr. 26, 2012 in Korean Application No. 10-2011-0032960, filed Apr. 8, 2011.

European Search Report in Euorpean Application No. 12767340, dated Nov. 18, 2014.

* cited by examiner

SOLAR CELL AND MANUFACTURING METHOD THEREOF

CROSS-REFERENCE TO RELATED APPLICATIONS

This application is the U.S. national stage application of International Patent Application No. PCT/KR2012/002658, filed Apr. 6, 2012, which claims priority to Korean Application No. 10-2011-0032960, filed Apr. 8, 2011, the disclosures of each of which are incorporated herein by reference in their entirety.

TECHNICAL FIELD

Embodiments relate to a solar cell and a manufacturing method thereof.

BACKGROUND ART

As the need for energy is increased recently, development on a solar cell that converts solar energy into electrical energy is in progress.

Especially, a Copper Indium Gallium Selenide (CIGS) based solar cell, i.e., a pn-hetero junction device having a substrate structure including a glass substrate, a metallic back electrode layer, a p-type CIGS based light absorbing layer, a high resistance buffer layer, and an n-type window layer, is widely being used nowadays.

A variety of research is being conducted on a barrier layer which can prevent impurity diffusion in a substrate of the solar cells.

DISCLOSURE OF INVENTION

Technical Problem

Embodiments provide a solar cell having improved reliability and productivity and a manufacturing method thereof.

Solution to Problem

A solar cell according to an embodiment includes a substrate; a barrier layer of a nano-rod structure on the substrate; a back electrode layer disposed on the barrier layer; a light absorbing layer disposed on the back electrode layer; a buffer layer disposed on the light absorbing layer; and a window layer disposed on the buffer layer.

Advantageous Effects of Invention

According to embodiments, the barrier layer of a nano-rod structure can effectively prevent impurities from being diffused to the light absorbing layer. And also, the barrier layer has a relatively less thickness than the existing barrier layers, thus providing a solar cell having increased productivity.

MODE FOR THE INVENTION

In the descriptions of embodiments, it will be understood that when a substrate, a layer, a film or an electrode is referred to as being on or under another substrate, layer, film or electrode, it can be directly on or under another layer or substrate, or intervening layers may also be present. Further, the reference about on and under each component layer will be made on the basis of drawings. In addition, the sizes of elements and the relative sizes between elements may be exaggerated for further understanding of the present disclosure.

Figure 1:
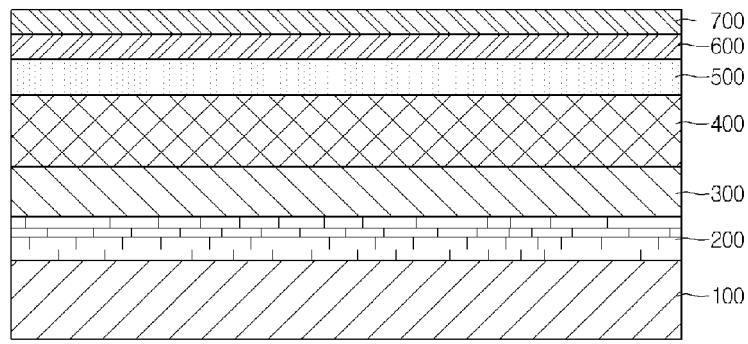
FIG. 1 is a cross-sectional view illustrating a solar cell according to an embodiment.

FIG. 1 is a cross-sectional view illustrating a solar cell according to an embodiment.

Referring to FIG. 1, a solar cell panel includes a substrate 100, a barrier layer 200, a back electrode layer 300, a light absorbing layer 400, a buffer layer 500, a high resistance buffer layer 600, and a window layer 700.

The substrate 100 is in a plate shape and supports the barrier layer 200, the back electrode layer 300, the light absorbing layer 400, the buffer layer 500, the high resistance buffer 600, and the window layer 700.

The substrate 100 may be an electrical insulator. The substrate 100 may be made of glass, plastic, or metal. Alternatively, the substrate 100 may be made of ceramic, metal (for example, copper) foil, Steel Us Stainless (SUS), and polymer with flexibility. The substrate 100 may be transparent and rigid or flexible.

The barrier layer 200 is formed on the substrate 100. The barrier layer 200 can prevent impurities on the substrate 100 from being diffused upwards.

Figure 2:
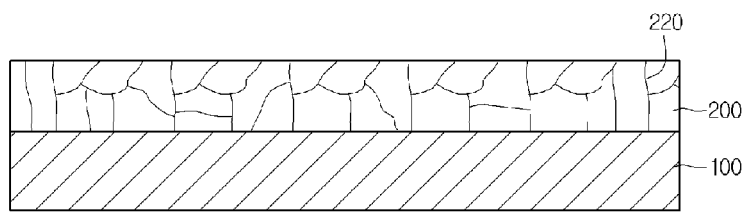
FIG. 2 is a sectional view of a typical barrier layer.

FIG. 2 is a sectional view of a typical barrier layer 200. To effectively prevent impurities on the substrate 100 from being diffused upwards, a material such as oxide (for example, Al2O3, SiO2) or metal (for example, Cr, Ti) is deposited to a thickness of 2 µm or more to form the typical barrier layer 200. So, it may have the improvement in production cost and time.

And also, the typical barriers layer 200 is grown toward a c-axis, which is a vertical growth direction, in a columnar shape and thus impurities may be diffused upwards through an interface 220 inside the barrier layer formed in a columnar shape. So, it may have the improvement in efficiency of the barrier layer.

To solve these problems, the present invention presents a barrier layer of a nano-rod structure. The barrier layer 200 of a nano-rod structure may include zinc oxide (ZnO). The nano-rod is grown horizontally.

The buffer layer 200 may have a thickness of about 0.5 µm to about 1 µm.

Zinc oxide, which is a binary oxide semiconductor, is in a wurzite crystal structure having a hexagonal system and is a direct transition 3-5 group compound semi-conductor material having a wide band gap of 3.37 eV and a great exciton binding energy in a room temperature.

Using a barrier layer of a nano-rod structure formed horizontally on a substrate of a solar cell effectively prevents impurities on a substrate from being diffused upwards, thereby improving the reliability of devices.

Furthermore, the barrier layer 200 has the improved efficiency as above and thus a decreased thickness, thereby enhancing productivity.

The zinc oxide (ZnO) nano-rod may be manufactured by various methods such as a method of using Anodic Aluminum Oxide Template, Vapor Liquid Solid method, Vapor Liquid Solid growth method, MOVPE growth method, CVD, and a growth method using vapor generated by evaporating metallic zinc or zinc vapor generated by reducing zinc oxide.

The back electrode layer 300 is disposed on the barrier layer 200. The back electrode layer 300 is a conductive layer. The back electrode layer 300 allows an electric charge generated in the optical absorbing layer 400 of a solar cell to move outside the solar cell. That is, current flows out of the solar cell through the back electrode layer 300. To perform this function, the back electrode layer 300 has high electric conductivity and low resistivity.

Also, the back electrode layer 300 should have high temperature stability during thermal treatment in a sulfur (S) or selenium (Se) atmosphere which is accompanied with CIGS compound formation. Also, the back electrode layer 300 has good adhesion with the substrate 100 such that delamination between the back electrode layer 300 and the substrate 100 caused by the difference in thermal expansion coefficients does not occur.

The back electrode layer 300 may be formed of any one of molybdenum (Mo), gold (Au), aluminum (Al), chrome (Cr), tungsten (W), and copper (Cu). In particular, the difference in thermal expansion coefficients between molybdenum (Mo) and the substrate 100 is less than the difference between another chemical element and the substrate 100, and thus molybdenum (Mo) has good adhesion, thereby preventing delamination and significantly meeting properties required for the back electrode layer 300.

The back electrode layer 300 may include two or more layers. In this case, the respective two or more layers may be formed of the same metal or different metals.

The light absorbing layer 400 may be formed on the back electrode layer 300. The light absorbing layer 400 includes a p-type semiconductor compound. In more detail, the light absorbing layer 400 includes group I-III-VI compounds. For example, the light absorbing layer 400 may have a copper-indium-gallium-selenide based (Cu(In,Ga)Se2;CIGS based) crystal structure, a copper-indium-selenide based crystal structure, or a copper-gallium-selenide based crystal structure. The light absorbing 400 may have an energy band gap ranging from about 1.1 eV to about 1.2 eV.

The buffer layer 500 is disposed on the light absorbing layer 400. A solar cell with the light absorbing layer 400 of a CIGS compound has a pn junction formed between a CIGS compound thin film, p-type semiconductor and a transparent electrode layer thin film, n-type semiconductor. However, since the two materials have the great differences in lattice constant and band gap energy, a buffer layer is necessary therebetween for a good junction.

The buffer layer 500 is formed of CdS and ZnS, and CdS is better in terms of power conversion efficiency of a solar cell. The buffer layer 500 has an energy band gap ranging from about 2.2 eV to about 2.5 eV.

The high resistance buffer layer 600 is disposed on the buffer layer 500. The high resistance buffer layer 600 includes zinc oxide (i-ZnO) undoped with an impurity. The high resistance buffer layer 600 has an energy band gap of about 3.1 eV to about 3.3 eV.

The window layer 700 is disposed on the high resistance buffer layer 600. The window layer 700 is a transparent electrical conductive layer. The resistance of the window layer 700 is higher than that of the back electrode layer 300.

The window layer 700 includes an oxide. For example, the window layer 700 may include zinc oxide, induim tin oxide (ITO), or induim zinc oxide (IZO).

Also, the window layer 700 may include Al doped zinc oxide (AZO) or Ga doped zinc oxide (GZO).

According to embodiments of the present invention, the barrier layer 200 of a nano-rod structure can prevent impurities from being diffused from the substrate 100 to the light absorbing layer 400 and be relatively thin, thus providing a solar cell having increased productivity.

FIGS. 3 to 6 are sectional views illustrating a method of manufacturing a solar cell according to an embodiment. Descriptions of the method refer to the previous description of the solar cell. The previous description of the solar cell may be coupled to the description of the manufacturing method.

Figure 3:
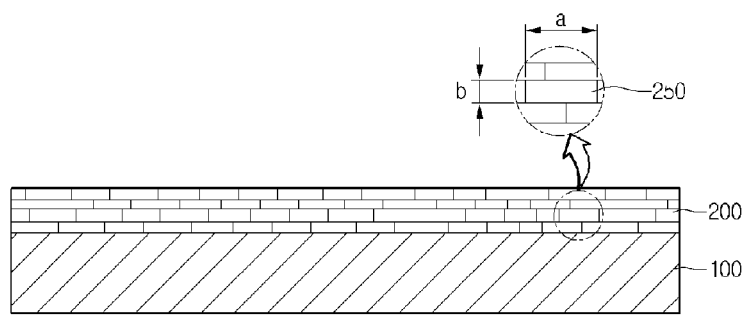
FIGS. 3 to 6 are views illustrating a method of manufacturing a solar cell panel according to an embodiment.

Referring to FIG. 3, the barrier layer 200 may be formed on the substrate 100. The substrate 100 may be flexible.

The barrier layer 200 may have a nano-rod structure and a thickness of about 0.5 μm to about 1 μm. Each nano-road may have a ratio of a width (a) to a length (b) of 10≤a/b≤1000 and the length (b) ranging from about 10 nm to about 100 nm.

Figure 7:
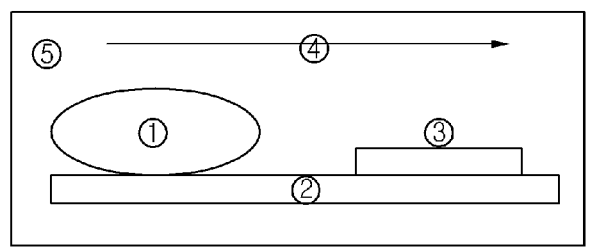
FIG. 7 is a sectional view illustrating a structure of a reactor on growth of nano-rods and nano-wires according to the present invention.

FIG. 7 is a sectional view illustrating a structure of a reactor on growth of nano-rods and nano-wires according to the present invention.

The barrier layer 200 having a structure of zinc oxide nano-rods and nano-wires is grown, by positioning a zinc raw material ① and a substrate ③ to be spaced apart on a supporting plate ②, heating the inside of a reactor ⑤ at about 300° C. to about 600° C. to volatilize the zinc raw material ① to be in a gas state, flowing reaction gas with impurities into the reactor in a horizontal direction ④ to convert some of the zinc gas into zinc oxide gas, and absorbing the zinc gas or zinc oxide gas onto the substrate ③ to perform diffusion and deposition Heating temperature is an important factor for controlling the volatilization of zinc. High heating temperature allows more zinc to be volatilized and increases kinetic energy of the volatilized zinc gas and thus its velocity and distance. Accordingly, as heating temperature increases, a ratio of a width (a) to a length (b) of each nano-rod can increase.

Figure 4:
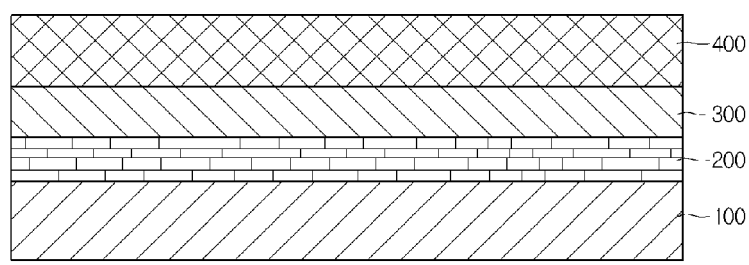

Referring to FIG. 4, the barrier layer 200 may be formed on the back electrode layer 300. The back electrode layer 300 may be deposited using molybdenum. The back electrode layer 300 may be formed by Physical Vapor Deposition (PVD) or plating.

Additionally, a diffusion barrier film may be disposed between the substrate 100 and the back electrode layer 300.

Then, the light absorbing layer 400 may be formed on the back electrode layer 300. A method of simultaneously or separately evaporating copper, indium, gallium, and selenide and a method of forming a metallic precursor film and then using a selenization process are widely being used to form the light absorbing layer 400 of a copper-indium-gallium-selenide based (Cu(In,Ga)Se2; CIGS based) semiconductor.

In more detail, the metal precursor film is formed on the back electrode layer 200 in a sputtering process using a copper target, an indium target, and a gallium target.

Then, a selenization process is performed on the metal precursor film to form the light absorbing layer 400 of a copper-indium-gallium-selenide based (Cu(In,Ga)Se2; CIGS based) semiconductor compound.

Alternatively, the sputtering process using a copper target, an indium target, and a gallium target, and the selenization process may be simultaneously performed.

Alternatively, a sputtering process using a copper target and an indium target or using a copper target and a gallium target, and a selenization process may be performed to form the light absorbing layer 400 of a CIS or CIG based semiconductor compound.

Figure 5:
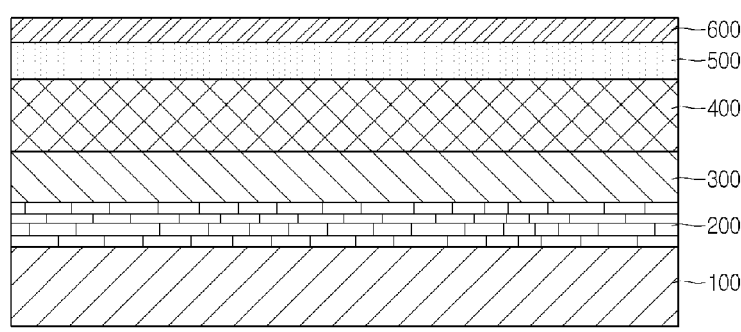

Referring to FIG. 5, cadmium sulfide is deposited on the light absorbing layer 400 through a sputtering process or a chemical bath deposition (CBD) method to form the buffer layer 400.

Then, zinc oxide is deposited on the buffer layer 400 through a sputtering process to form the high resistance buffer layer 600.

The buffer layer 400 and the high resistance buffer layer 600 have small thicknesses.

For example, the buffer layer 400 and the high resistance buffer layer 600 may have a thickness of about 1 nm to about 80 nm.

Figure 6:
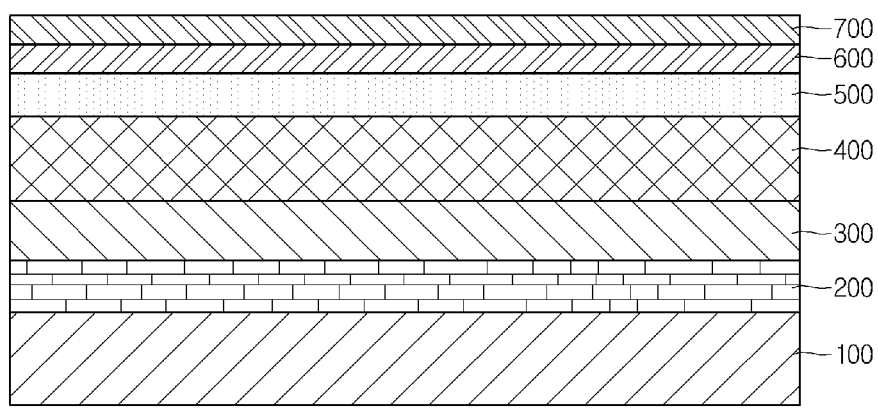

Referring to FIG. 6, the window layer 700 is formed on the high resistance buffer layer 600. A transparent conductive material is deposited on the high resistance buffer layer 600 to form the window layer 700.

Features, structures, and effects described in the above embodiments are incorporated into at least one embodiment of the present disclosure, but are not limited to only one embodiment. Moreover, features, structures, and effects exemplified in one embodiment can easily be combined and modified for another embodiment by those skilled in the art. Therefore, these combinations and modifications should be construed as falling within the scope of the present disclosure.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell comprising:
   a substrate;
   a barrier layer on the substrate;
   a back electrode layer disposed on the barrier layer;
   a light absorbing layer disposed on the back electrode layer;
   a buffer layer disposed on the light absorbing layer;
   a high resistance buffer layer disposed on the buffer layer: and
   a window layer disposed on the buffer layer;
   wherein the barrier layer includes nano-rods,
   wherein a height of the nano-rods is in a range or 0.5 μm to 1 μm,
   wherein a width (a) of each of the nano-rods is greater than its length (b),
   wherein each of the nano-rods has a ratio of the width (a) to the length (b) of $20 \leq (a/b) \leq 1000$ ,
   wherein the length (b) of each of the nano-rods is in a range of from about 10 nm to about 100 nm,
   wherein the nano rods of the barrier layer are formed horizontally on the substrate of the solar cell, such that a side having the width (a) of each nano-rod is parallel to an upper surface of the substrate,
   wherein the barrier layer includes a first zinc oxide having a wurtzite crystal structure and having a band gap of 3.37 eV, and
   wherein the high resistance buffer layer includes a second zinc oxide having an energy band gap in a range 3.1 eV to 3.3 eV.

2. The solar cell according to claim 1, wherein the substrate is a stainless steel or metal thin film substrate.

* * * * *